(12) United States Patent
Chusseau

(10) Patent No.: US 11,596,085 B2
(45) Date of Patent: Feb. 28, 2023

(54) ELECTRICAL EQUIPMENT INCLUDING A COVER AND A HEATSINK

(71) Applicant: SAGEMCOM BROADBAND SAS, Rueil Malmaison (FR)

(72) Inventor: Hugo Chusseau, Rueil Malmaison (FR)

(73) Assignee: SAGEMCOM BROADBAND SAS, Rueil Malmaison (FR)

( * ) Notice: Subject to any disclaimer, the term of this patent is extended or adjusted under 35 U.S.C. 154(b) by 126 days.

(21) Appl. No.: 16/912,020

(22) Filed: Jun. 25, 2020

(65) Prior Publication Data

US 2020/0413567 A1   Dec. 31, 2020

(30) Foreign Application Priority Data

Jun. 25, 2019   (FR) ..................... 19 06863

(51) Int. Cl.
| | |
|---|---|
| *H05K 7/20* | (2006.01) |
| *H04R 1/28* | (2006.01) |
| *H04R 3/00* | (2006.01) |
| *H05K 1/02* | (2006.01) |
| *H05K 5/03* | (2006.01) |
| *H05K 7/14* | (2006.01) |

(52) U.S. Cl.
CPC ......... *H05K 7/20409* (2013.01); *H04R 1/288* (2013.01); *H04R 3/00* (2013.01); *H05K 1/0203* (2013.01); *H05K 5/03* (2013.01); *H05K 7/1427* (2013.01); *H04R 2400/11* (2013.01)

(58) Field of Classification Search
CPC .... H05K 7/20409; H05K 1/0203; H05K 5/03; H05K 7/1427; H04R 1/288; H04R 3/00; H04R 2400/11
USPC ......................................................... 381/111
See application file for complete search history.

(56) References Cited

U.S. PATENT DOCUMENTS

| | | | |
|---|---|---|---|
| 5,909,358 A | 6/1999 | Bradt | |
| 2002/0101720 A1 | 8/2002 | Kline et al. | |
| 2018/0192526 A1* | 7/2018 | Suzuki | ................ H05K 5/0008 |

FOREIGN PATENT DOCUMENTS

| | | |
|---|---|---|
| CN | 103411140 A | 11/2013 |
| CN | 108770307 A | 11/2018 |
| CN | 208386836 U | 1/2019 |
| EP | 3214911 A1 | 9/2017 |

OTHER PUBLICATIONS

"Integral, structural, natural convection cooled heatsink"; Research Disclosure, Feb. 2001, pp. 238-240 (XP-001103746).

* cited by examiner

*Primary Examiner* — Paul Kim
(74) *Attorney, Agent, or Firm* — Muncy, Geissler, Olds & Lowe, P.C.

(57) ABSTRACT

Electrical equipment comprising a cover, a circuit board, and a heatsink arranged to dissipate heat produced by the circuit board outwards from the electrical equipment, the heatsink comprising at least one free fin and at least one fastener fin, the electrical equipment being such that, when the electrical equipment is assembled, the free fin(s) extend(s) outwards from the electrical equipment without being covered by the cover, and the cover is snap-fastened to the fastener fin(s).

11 Claims, 7 Drawing Sheets

ELECTRICAL EQUIPMENT INCLUDING A COVER AND A HEATSINK

The invention relates to the field of electrical equipment including a cover and a heatsink.

BACKGROUND OF THE INVENTION

Numerous pieces of electrical equipment include a circuit board having installed thereon electronic components that heat up quite considerably in operation.

In such electrical equipment, a cooling device is used, e.g. a finned heatsink, in order to cool the circuit board so as to ensure that the electrical equipment operates correctly. In order to be effective, the finned heatsink must present a large area of contact with the air.

Such electrical equipment requiring a cooling device includes, in particular, certain so-called "connected objects".

Connected objects are pieces of electrical equipment that perform a certain number of functions and that are designed to communicate via a wireless network in order to be controlled by or else to exchange data with a smartphone, a tablet, or a laptop computer.

Such connected objects include smart speakers, voice assistants, surveillance cameras, etc.

Connected objects often present a highly sophisticated "look", which is sometimes responsible, at least in part, for their commercial success. A connected object is thus frequently provided with a cover that may extend for example over one face of the connected object or that may surround the connected object at least in part, and that has the function not only, naturally, of protecting the inside of the connected object, but also of improving the look of the connected object.

The cover is thus a decorative part that is frequently sensitive to wear and liable to become scratched.

The cover therefore needs to be easy to install on and lock to the connected object. At the end of manufacturing the connected object, at the moment of its final assembly, this serves to limit any risk of deteriorating the cover.

Likewise, in order to limit any risk of deterioration, the cover must be easy to release and remove from the connected object during after sales service.

OBJECT OF THE INVENTION

An object of the invention is to provide electrical equipment, e.g. a connected object, that includes both a heatsink and also a cover that is easy to install and remove.

SUMMARY OF THE INVENTION

In order to achieve this object, there is provided electrical equipment comprising a cover, a circuit board, and a heatsink arranged to dissipate heat produced by the circuit board outwards from the electrical equipment, the heatsink comprising at least one free fin and at least one fastener fin, the electrical equipment being such that, when the electrical equipment is assembled, the free fin(s) extend(s) outwards from the electrical equipment without being covered by the cover, and the cover is snap-fastened to the fastener fin(s).

The cover of the electrical equipment of the invention is thus fastened by being snap-fastened to the fastener fin(s).

Snap-fastening involves manipulation that is very simple and much less constricting for the cover than a more conventional fastening technique, e.g. such as screw fastening. The cover can be installed on or around the electrical equipment and it can be secured thereto without damaging the cover. The cover can also be released and removed very easily.

It should be observed that it is possible to design the snap-fastening in such a manner that a user cannot remove the cover without using a tool, but that after sales service can remove it quickly by using a tool that is very simple.

There is also provided electrical equipment as described above, wherein the heatsink has two fastener fins and wherein the free fin(s) is/are positioned between the fastener fins.

There is also provided electrical equipment as described above, wherein the cover is generally cylindrical in shape, having an opening that extends over the entire length of the cover, the opening being defined between two lateral ends of the cover, the cover being arranged in such a manner that, when the electrical equipment is assembled, the cover surrounds the electrical equipment and the two lateral ends of the cover are snap-fastened to the two fastener fins.

There is also provided electrical equipment as described above, wherein the cover has two longitudinal splines that extend from an inside surface of the cover and each of which runs along an edge of a respective one of the lateral ends, the shape of each longitudinal spline being complementary to the shape of a fastener fin.

There is also provided electrical equipment as described above, wherein each longitudinal spline slopes towards the inside of the cover, and wherein each fastener fin includes an internal sloping portion that slopes towards the inside of the heatsink.

There is also provided electrical equipment as described above, including a damper device positioned between the cover and the fastener fin.

There is also provided electrical equipment as described above, wherein the damper device comprises foam that covers the fastener fin, at least in part.

There is also provided electrical equipment as described above, wherein the damper device comprises fabric that covers the cover, at least in part.

There is also provided electrical equipment as described above, wherein the cover has a thermally conductive surface that is in direct or indirect contact with at least one fastener fin, such that the cover contributes to dissipating the heat produced by the circuit board outwards from the electrical equipment.

There is also provided electrical equipment as described above, the electrical equipment being a smart speaker.

There is also provided a method of constructing electrical equipment as described above, the method comprising the steps of:
 installing the circuit board and the heatsink;
 spacing apart the two lateral ends of the cover;
 surrounding the electrical equipment with the cover;
 snap-fastening the two lateral ends of the cover onto the two fastener fins.

There is also provided a method of dismantling electrical equipment as described above, the method comprising the steps of:
 undoing the snap-fastening between the two fastener fins and the two lateral ends of the cover;
 removing the cover from the electrical equipment.

The invention can be better understood in the light of the following description of a particular, nonlimiting embodiment of the invention.

BRIEF DESCRIPTION OF THE DRAWINGS

Reference is made to the accompanying drawings, in which.

DETAILED DESCRIPTION OF THE INVENTION

Figure 1:
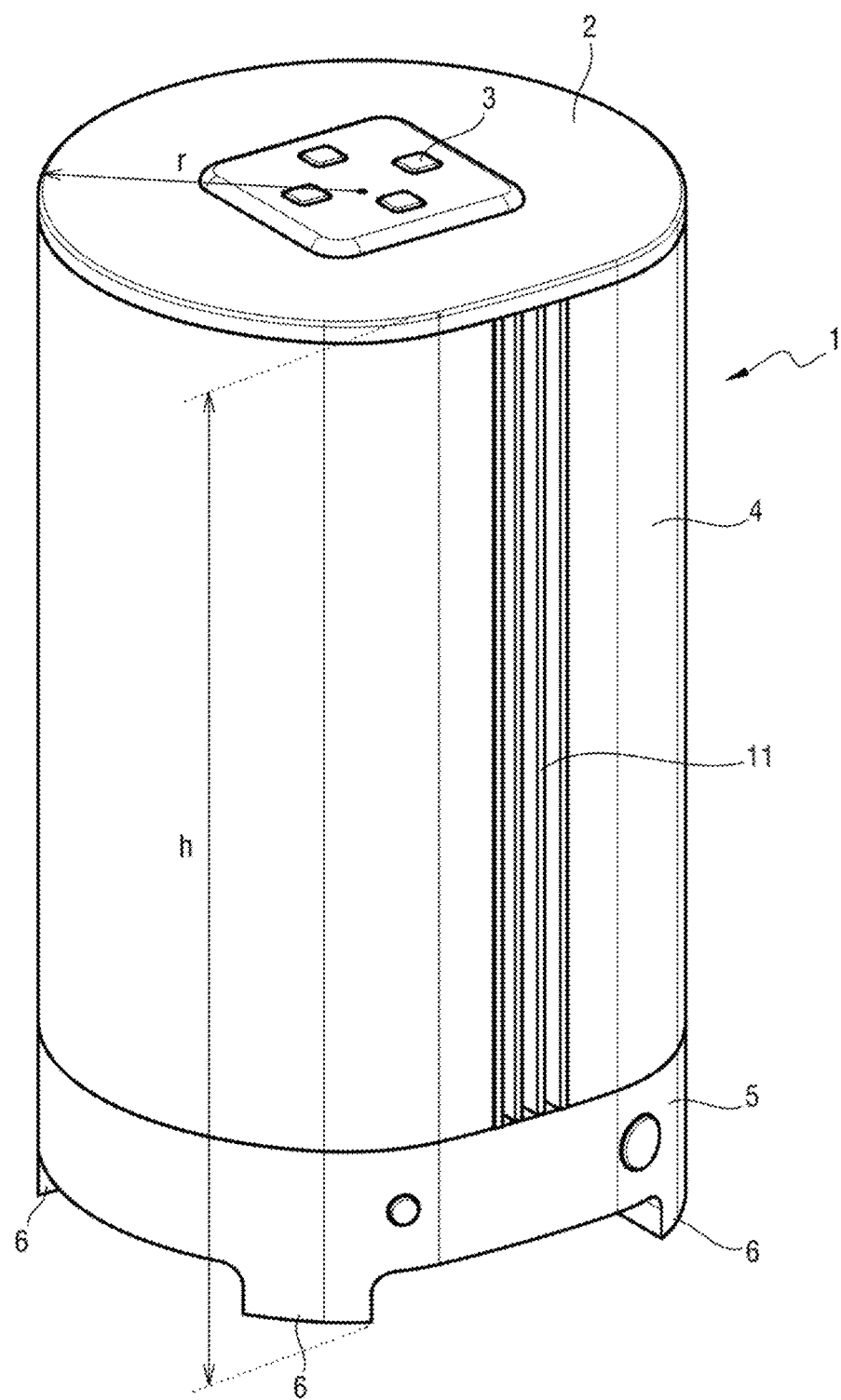
FIG. 1 is a perspective view of a piece of electrical equipment of the invention, in this example a smart speaker.
Figure 2:
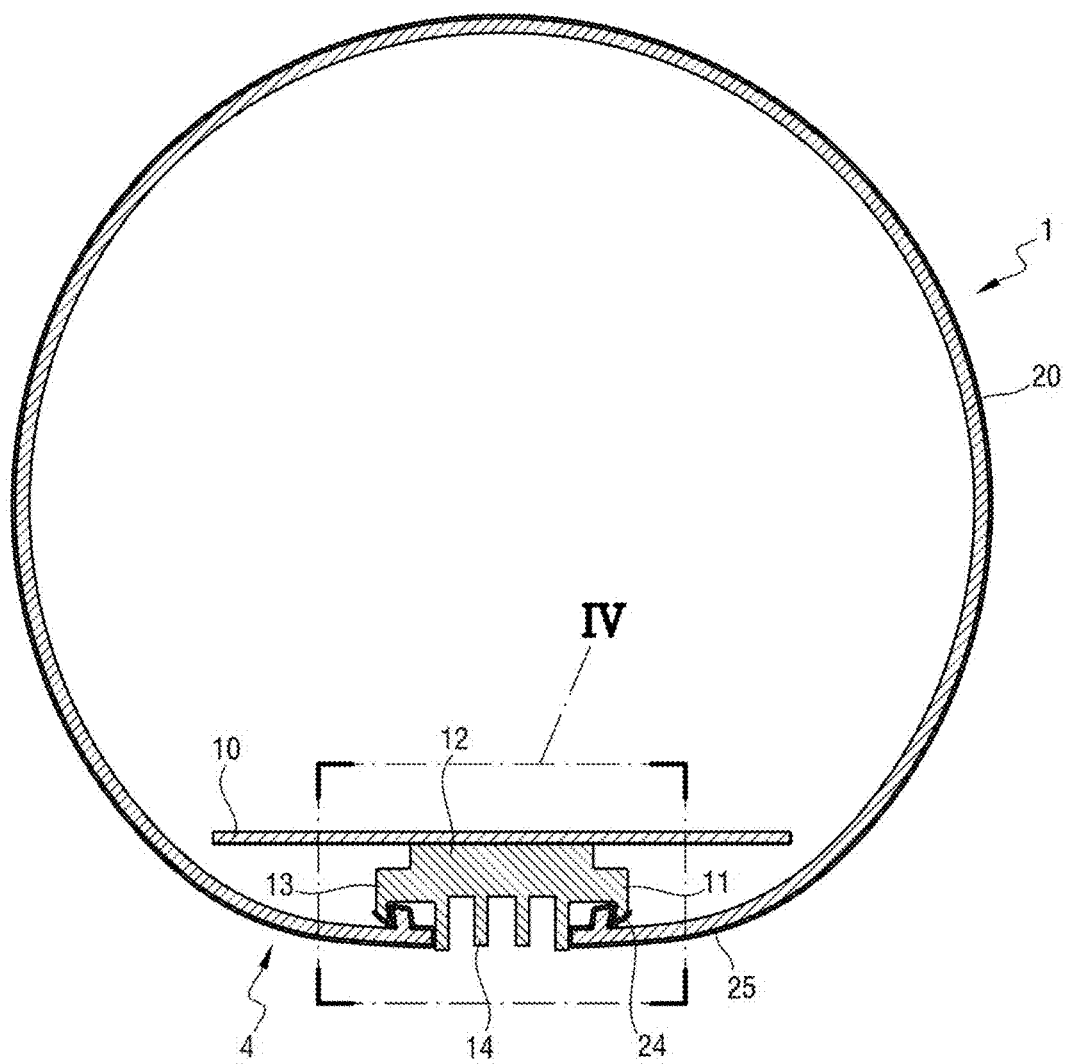
FIG. 2 is a simplified section view of the smart speaker on a plane perpendicular to the height of the smart speaker.
Figure 3:
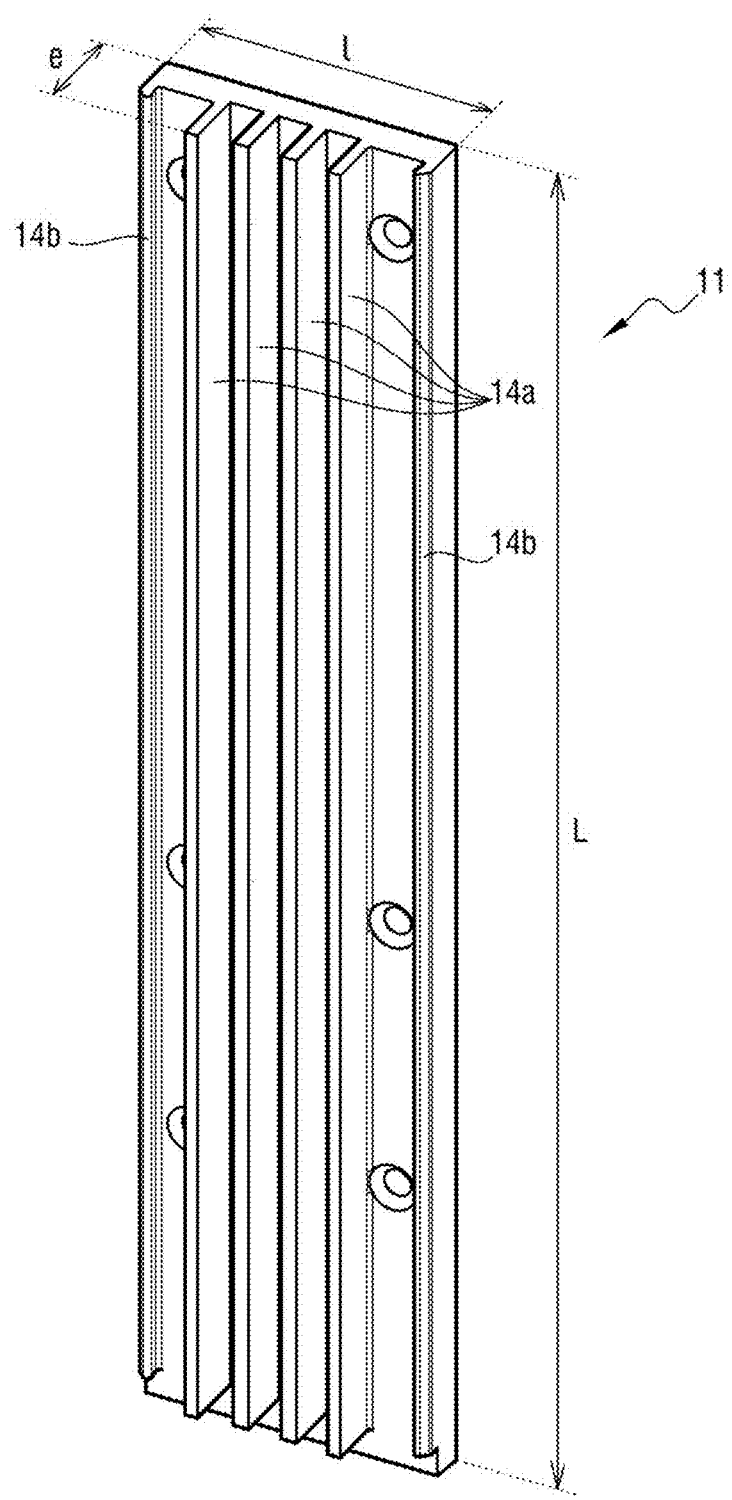
FIG. 3 is a perspective view of the heatsink of the smart speaker.

With reference to FIGS. 1 to 3, and in this example, the electrical equipment of the invention is a smart speaker 1 that, in conventional manner, comprises a plurality of loudspeakers, means for generating electrical signals that are applied to the loudspeakers, and from which the loudspeakers produce sound signals, and wireless communication means enabling the smart speaker 1 to communicate via a wireless network.

The general shape of the smart speaker 1 is that of a cylinder presenting a section in the form of a disk of radius r with an angular portion of its circumference being flattened.

The height h of the smart speaker 1 is greater than its radius r.

The smart speaker 1 has a top plate 2 situated on a top face of the smart speaker 1. The top plate 2 has control buttons 3 for the smart speaker 1.

The smart speaker 1 has a rear face 4 that is defined by the flattened angular portion of the circumference of its section. At its bottom, the smart speaker 1 also has a base 5 that includes legs 6 enabling the smart speaker 1 to stand on a flat support.

The smart speaker 1 also has an internal chassis (not shown) that extends between the top plate 2 and the bottom base 5. Some of the loudspeakers are fastened to the internal chassis.

The smart speaker 1 also has a circuit board 10. The circuit board 10 carries a plurality of electronic components (not shown) that are liable to heat up in operation.

The smart speaker 1 also has a heatsink 11 for dissipating heat produced by the circuit board 10 outwards from the smart speaker 1.

In this example, the heatsink 11 is made of extruded aluminum. Naturally, any thermally conductive material and any method of manufacture could be used to make the heatsink 11.

The heatsink 11 presents a shape that is elongate and of small thickness: the length L of the heatsink 11 is greater than its width l, which is greater than its thickness e.

The heatsink 11 comprises a base 12, a main portion 13, and fins 14, arranged in succession in that order across its thickness e. The base 12 does not extend along the full length L of the heatsink 11, but only over certain portions thereof.

The fins 14 extend perpendicularly from the main portion 13 and parallel to the length L of the heatsink 11.

Figure 4:
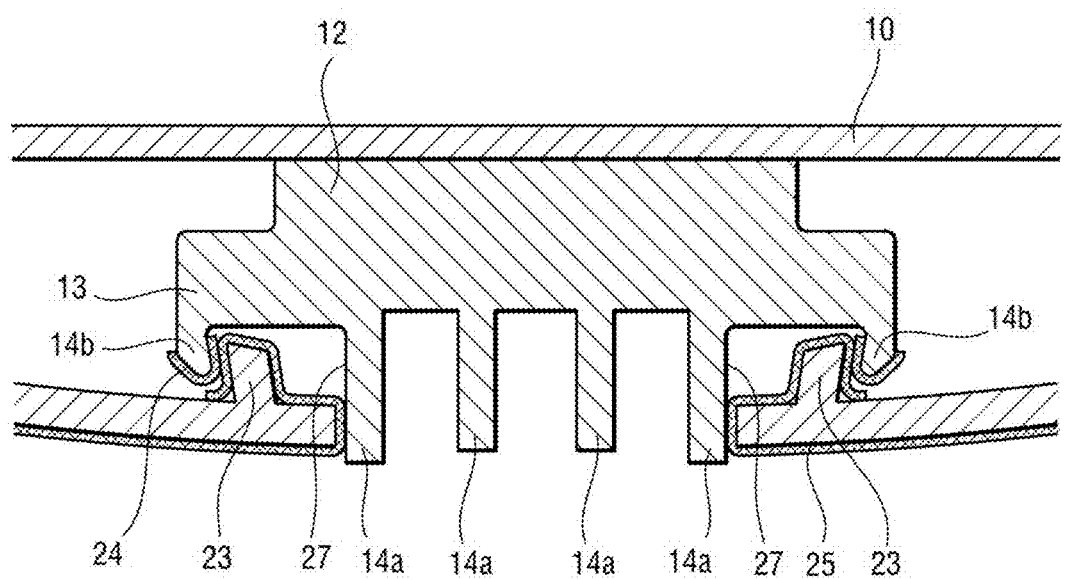
FIG. 4 is a detailed view of FIG. 2.
Figure 5:
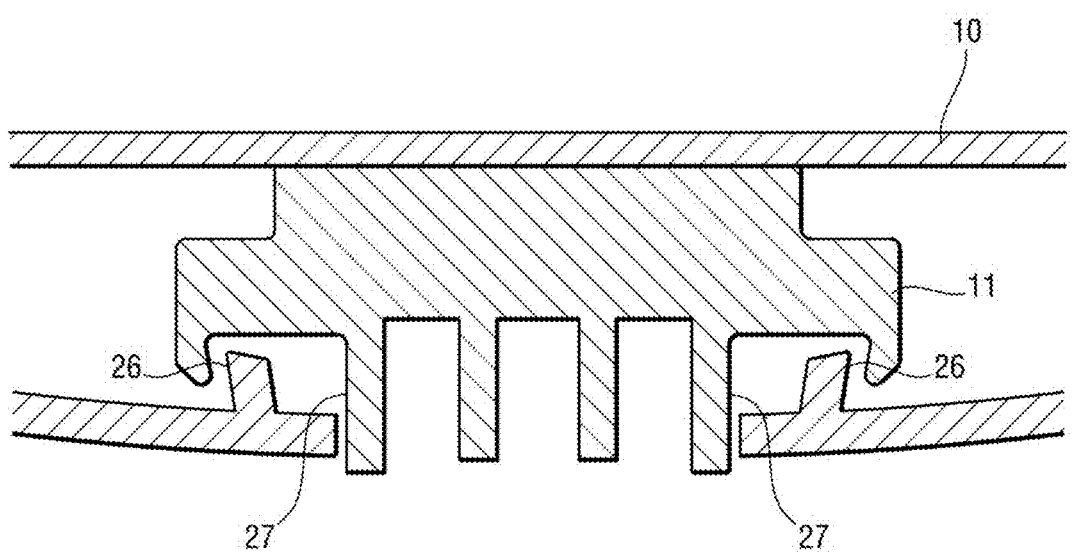
FIG. 5 is a view similar to the view of FIG. 4, the cover not being covered in fabric and the fastener fins not being covered in foam.
Figure 6:
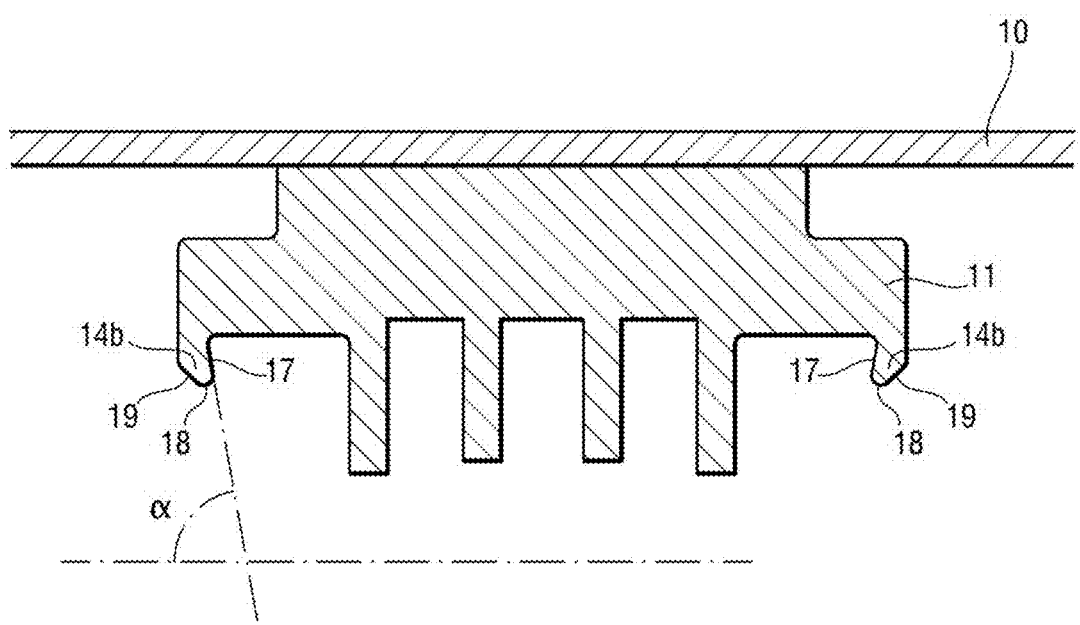
FIG. 6 is a view similar to the view of FIG. 5, the cover not being shown.

With reference to FIGS. 4 to 6, the fins 14 comprise at least one free fin 14a and at least one fastener fin 14b, and in this example they comprise four free fins 14a and two fastener fins 14b. The free fins 14a are positioned between the fastener fins 14b, with the fastener fins 14b being positioned at the sides of the heatsink 11 at the ends of its width l.

Each fastener fin 14b has an internal sloping portion 17 positioned facing the inside of the heatsink 11 (i.e. facing the adjacent free fin 14a), a rounded portion 18, and an external sloping portion 19 positioned facing outwards from the heatsink 11. The internal sloping portion 17 slopes a little towards the inside of the heatsink 11, and thus towards the free fins 14a, at an angle $\alpha$ relative to a direction parallel to the width l of the heatsink 11, the angle $\alpha$ being less than 90°. The rounded portion 18 and the external sloping portion 19 constitute the end of the fastener fin 14b. The fastener fin 14b thus forms a hook pointing towards the inside of the heatsink 11.

The fastener fins 14b are covered in foam 24. The foam 24 covers the fastener fins 14b over their entire length, or else over only portions of their length.

Figure 7:
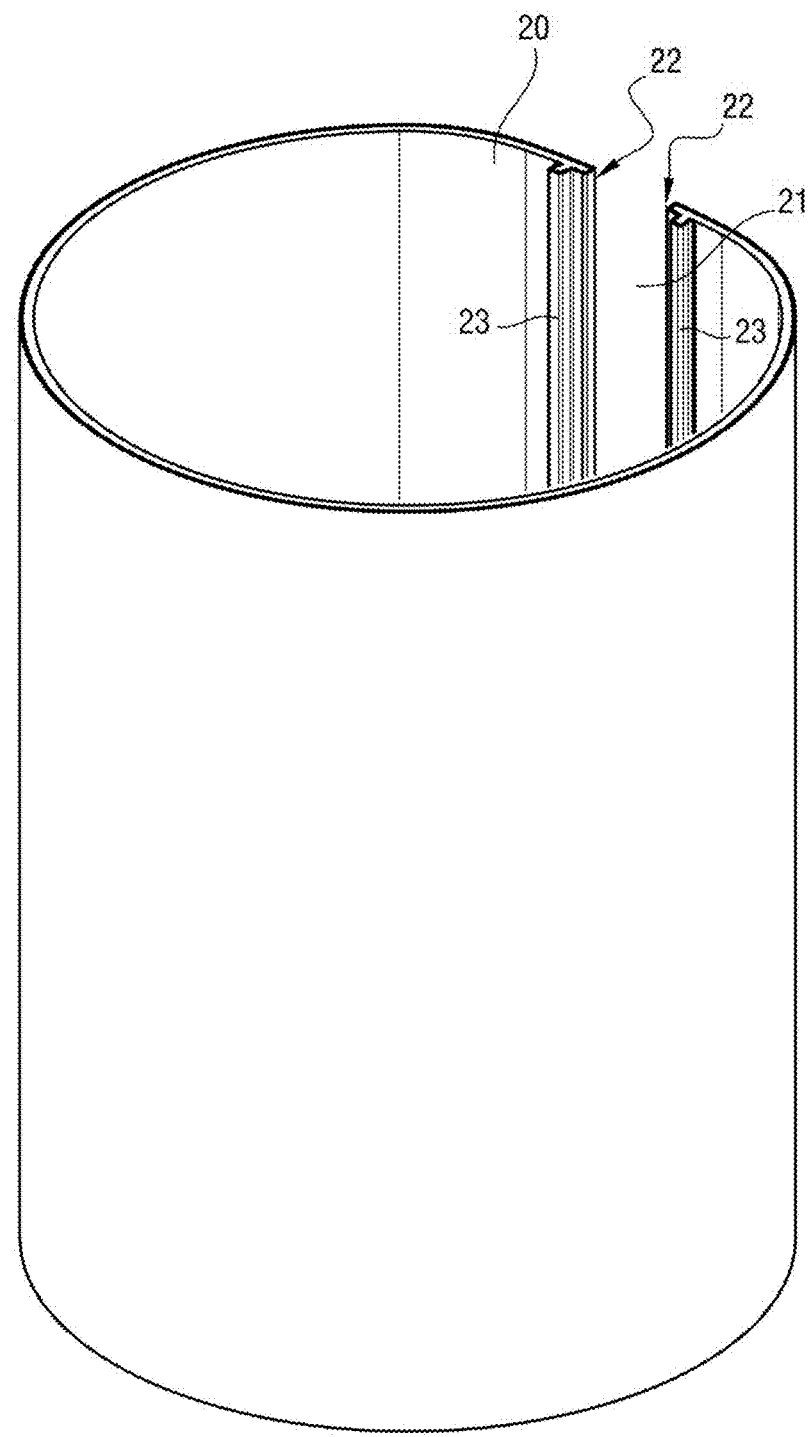
FIG. 7 is a perspective view of the cover of the smart speaker.
Figure 8:
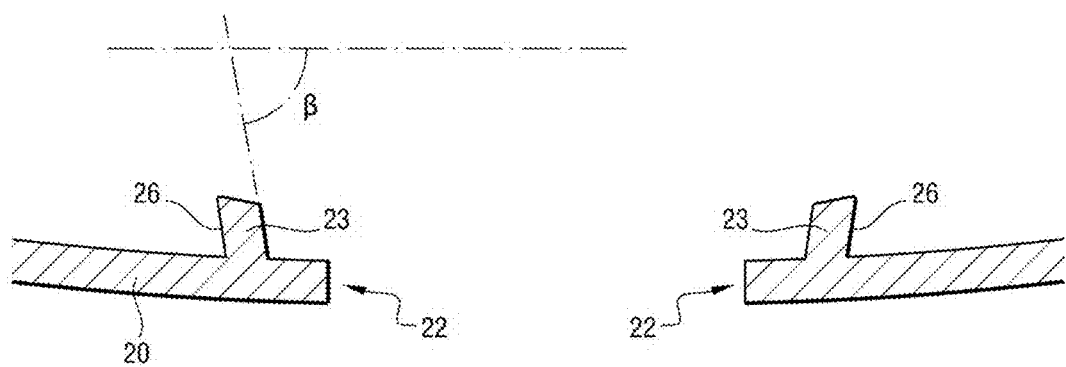
FIG. 8 is a section view of the lateral ends of the cover on a plane perpendicular to the length of the cover.

With reference to FIGS. 7 and 8, the smart speaker 1 also includes a cover 20. The cover 20 is generally cylindrical in shape, having as its section a circle of radius r with its circumference presenting an angular portion that is flattened: it is the cover 20 that gives the smart speaker 1 its outside shape.

The cover 20 is made out of plastics material.

The cover 20 has an opening 21 that extends over the entire length of the cover 20, the opening 21 being defined between two lateral ends 22 of the cover 20.

As a result of the material from which it is made and because of the opening 21, the cover 20 presents a degree of springiness.

The cover 20 has two longitudinal splines 23, each extending from an inside surface of the cover 20. Each longitudinal spline 23 is positioned in the proximity of the edge of a respective one of the lateral ends 22, and it runs along the edge of said lateral end 22. Relative to the inside surface of the cover 20, each longitudinal spline 23 slopes at an angle $\beta$ towards the inside of the cover 20 (i.e. away from the opening 21). The angle $\beta$ is less than 90° and it is equal to the angle $\alpha$. The shape of each longitudinal spline 23 is thus complementary to the shape of a fastener fin 14b.

As can be seen in FIGS. 2 and 4, fabric 25 covers the entire outside surface of the cover 20, and also a narrow strip of the inside surface of the cover 20, running along all of its edges. In particular, both axial splines 23 are covered in the fabric 25.

With reference to the figures, there follows a description of certain steps in constructing the smart speaker 1 and of the way in which the above-described elements are assembled together.

The circuit board 10 is initially positioned in the proximity of the rear face 4 of the smart speaker 1 parallel to the flattened shape of the rear face 4. By way of example, the circuit board 10 is fastened to the internal chassis of the smart speaker 1.

The heatsink 11 is then installed. The heatsink 11 is fastened to the internal chassis of the smart speaker 1 so as to be interposed vertically between the top plate 2 and the bottom base 5.

The heatsink 11 is positioned between the rear face 4 and the circuit board 10. The base 12 of the heatsink 11 is in indirect contact with the circuit board 10: flexible thermally conductive material (not shown) is positioned between the circuit board 10 and the base 12 of the heatsink 11.

It should be observed at this point that it is not essential for the contact to be indirect, and that the heatsink could be put into direct contact with the circuit board 10 (or in any event with an electronic component).

The heatsink 11 is situated in a central portion of the rear face 4, and is parallel thereto. The length L of the heatsink 11 is parallel to the height h of the smart speaker 1. In this example, the heatsink 11 extends over (nearly) the entire height h of the smart speaker 1, with the exception of the height of the base 5 and the height of the top plate 2. All of the fins 14 of the heatsink 11 face outwards from the smart speaker 1.

The cover 20 is then put into place. To do this, the two lateral ends 22 are spaced apart a little and the cover 20 is positioned in such a manner that it surrounds the smart speaker 1.

The two lateral ends 22 of the cover 20 are snap-fastened onto respective ones of the two fastener fins 14b. The longitudinal splines and 23 are resiliently engaged with the fastener fins 14b, the fabric 25 on the inside face 26 of each longitudinal spline 23 coming into contact with the foam 24 that covers the internal sloping portion 17 of the corresponding fastener fin 14b.

It should be observed that the edge of each lateral end 22, or more precisely the fabric 25 that covers the edge, is in contact with an external plane face 27 of the free fin 14a adjacent to the corresponding fastener fin 14b. This configuration contributes to holding the cover 20 in position.

The cover 20 is thus fastened on and locked to the smart speaker 1.

The free fins 14a of the heatsink 11 are thus positioned between the lateral ends of 22 of the cover 20 and they extend outwards from the smart speaker 1, perpendicularly to the rear face 4 and without being covered by the cover 20. This configuration makes it possible to ensure that the heat produced by the circuit board 10 is dissipated very effectively by convection towards the outside.

In order to remove the cover 20, it suffices to undo the snap-fastening between the two fastener fins 14b and the two lateral ends 22 of the cover 20. The cover 20 can then be removed from the smart speaker 1.

It should be observed that the smart speaker 1 includes a damper device having two damper means: the foam 24 and the fabric 25.

While the smart speaker 1 is in operation, the damper device serves to damp the vibration and the noise, if any, that is generated at the interface between the cover 20 and the heatsink 11.

It should be observed that a single one of the damper means could suffice.

Advantageously, provision may be made for the cover 20 to have a surface that is thermally conductive (e.g. being made of metal) and that comes into contact with at least one fastener fin 14b. The cover 20 would then contribute to dissipating the heat produced by the circuit board 10 outwards from the smart speaker 1. The contact between the thermally conductive surface of the cover 20 and the fastener fin 14b may be contact that is direct or else indirect, i.e. through a thermally conductive material. The thermally conductive material could itself constitute damper means.

Naturally, the invention is not limited to the embodiment described, but covers any variant coming within the ambit of the invention as defined by the claims.

Naturally the invention does not apply solely to a cover that surrounds a piece of electrical equipment, but applies to any type of cover of any shape that is fastened to a heatsink.

The snap-fastener device may be different. In particular, the hook(s) could be located on the cover instead of on the heatsink. The cover could be snap-fastened onto only one fastener fin.

Likewise, the damper device could be different.

The electrical equipment of the invention is not necessarily a smart speaker: the invention applies to any type of connected object, and more generally to any type of electrical equipment.

The invention claimed is:

1. Electrical equipment comprising a cover, a circuit board, and a heatsink arranged to dissipate heat produced by the circuit board outwards from the electrical equipment, the heatsink comprising at least one free fin and two fastener fins, the free fin(s) is/are positioned between the fastener fins, the cover has an opening that extends over the entire length of the cover, the opening being defined between two lateral ends of the cover, the cover comprising two longitudinal splines that extend from an inside surface of the cover and each of which runs along an edge of a respective one of the lateral ends, the cover being arranged in such a manner that, when the electrical equipment is assembled, the cover surrounds the electrical equipment and the two lateral ends of the cover are snap-fastened to the two fastener fins, the longitudinal splines being resiliently engaged with the fastener fins, and the free fin(s) extending outwards from the electrical equipment without being covered by the cover.

2. The electrical equipment according to claim 1, wherein the shape of each longitudinal spline being complementary to the shape of a fastener fin.

3. The electrical equipment according to claim 2, wherein each longitudinal spline slopes towards the inside of the cover, and wherein each fastener fin comprises an internal sloping portion that slopes towards the inside of the heatsink.

4. The electrical equipment according to claim 1, including a damper device positioned between the cover and the fastener fin.

5. The electrical equipment according to claim 4, wherein the damper device comprises foam that covers the fastener fin, at least in part.

6. The electrical equipment according to claim 4, wherein the damper device comprises fabric that covers the cover, at least in part.

7. The electrical equipment according to claim 1, wherein the cover comprises a thermally conductive surface that is in direct or indirect contact with at least one fastener fin, such that the cover contributes to dissipating the heat produced by the circuit board outwards from the electrical equipment.

8. The electrical equipment according to claim 1, the electrical equipment being a smart speaker.

9. A method of constructing electrical equipment according to claim 1, the method comprising the steps of:
installing the circuit board and the heatsink;
spacing apart the two lateral ends of the cover;
surrounding the electrical equipment with the cover; and
snap-fastening the two lateral ends of the cover onto the two fastener fins.

10. A method of dismantling electrical equipment according to claim 1, the method comprising the steps of:
undoing the snap-fastening between the two fastener fins and the two lateral ends of the cover; and
removing the cover from the electrical equipment.

11. The electrical equipment according to claim 1, wherein the cover is generally cylindrical in shape.

\* \* \* \* \*